US011481055B2

(12) United States Patent
Afentakis

(10) Patent No.: US 11,481,055 B2
(45) Date of Patent: Oct. 25, 2022

(54) INTEGRATING PRESSURE SENSITIVE SENSORS WITH LIGHT EMITTING PICTURE ELEMENTS

(71) Applicant: Peratech Holdco Ltd, Richmond (GB)

(72) Inventor: Themistoklis Afentakis, Camas, WA (US)

(73) Assignee: Peratech Holdco Ltd, Richmond (GB)

( * ) Notice: Subject to any disclaimer, the term of this patent is extended or adjusted under 35 U.S.C. 154(b) by 112 days.

(21) Appl. No.: 16/976,684

(22) PCT Filed: Mar. 22, 2019

(86) PCT No.: PCT/GB2019/000051
§ 371 (c)(1),
(2) Date: Aug. 28, 2020

(87) PCT Pub. No.: WO2019/180400
PCT Pub. Date: Sep. 26, 2019

(65) Prior Publication Data
US 2021/0004105 A1    Jan. 7, 2021

Related U.S. Application Data

(60) Provisional application No. 62/646,501, filed on Mar. 22, 2018.

(30) Foreign Application Priority Data

Sep. 12, 2018   (GB) ........................................ 1814819

(51) Int. Cl.
*G06F 3/041*    (2006.01)
*G06F 3/045*    (2006.01)
(Continued)

(52) U.S. Cl.
CPC ............ *G06F 3/0412* (2013.01); *G06F 3/045* (2013.01); *G06F 3/04144* (2019.05);
(Continued)

(58) Field of Classification Search
CPC ............... H01L 27/3244; H01L 27/156; H01L 51/5284; H01L 27/3225; H01L 27/323;
(Continued)

(56) References Cited

U.S. PATENT DOCUMENTS

2010/0123671 A1   5/2010  Lee
2011/0057902 A1*  3/2011  Lee ........................ G06F 3/044
                                                   345/173
(Continued)

FOREIGN PATENT DOCUMENTS

CN    107122078 A    9/2017
EP      3252574 A1   12/2017

*Primary Examiner* — Thuy N Pardo
(74) *Attorney, Agent, or Firm* — Richard M. Goldberg

(57) ABSTRACT

Pressure sensitive sensors are integrated with light emitting picture elements (111 to 120). Light-emitting picture elements (111 to 120) are arranged upon a substrate (151), such that located light-emitting picture elements are surrounded by a black matrix (122) of non-light-emitting regions. A sensor matrix of pressure sensitive sensor elements (131 to 139) is located at regions of the black matrix, such that sensor elements are aligned at positions over the black matrix and do not occlude the light-emitting picture elements.

15 Claims, 5 Drawing Sheets

(51) Int. Cl.
    *H01L 27/15*      (2006.01)
    *H01L 27/32*      (2006.01)
    *H01L 51/52*      (2006.01)

(52) U.S. Cl.
    CPC .......... *H01L 27/156* (2013.01); *H01L 27/323* (2013.01); *H01L 27/3244* (2013.01); *H01L 51/5284* (2013.01)

(58) Field of Classification Search
    CPC ... H01L 27/3276; G06F 3/045; G06F 3/0412; G06F 3/04144
    USPC ........................................ 345/173, 174, 175
    See application file for complete search history.

(56) References Cited

U.S. PATENT DOCUMENTS

| | | | |
|---|---|---|---|
| 2011/0122348 A1 | 5/2011 | Sakai et al. | |
| 2011/0242465 A1* | 10/2011 | Lee | G06F 3/0446 349/110 |
| 2013/0341651 A1* | 12/2013 | Kim | G06F 3/0443 257/432 |
| 2017/0078513 A1* | 3/2017 | Chang | H04N 5/335 |
| 2017/0123546 A1 | 5/2017 | Zhan et al. | |
| 2017/0153766 A1* | 6/2017 | Kimura | G06F 3/0446 |
| 2017/0358637 A1* | 12/2017 | Lee | H01L 27/3251 |
| 2018/0019432 A1* | 1/2018 | Kurasawa | H01L 27/3265 |
| 2018/0120988 A1* | 5/2018 | Kim | G06F 3/0418 |
| 2018/0129327 A1* | 5/2018 | Kurasawa | G06F 3/04166 |
| 2019/0244977 A1* | 8/2019 | Sasaki | G06F 3/0445 |
| 2019/0245026 A1* | 8/2019 | Woo | H01L 51/5225 |

\* cited by examiner

INTEGRATING PRESSURE SENSITIVE SENSORS WITH LIGHT EMITTING PICTURE ELEMENTS

CROSS REFERENCE TO RELATED APPLICATIONS

This application claims priority from United States Patent Application number U.S. 62/646,501, filed on 22 Mar. 2018, the whole contents of which are incorporated herein by reference and British Patent Application GB 18 14 819.7, filed on 12 Sep. 2018, the whole contents of which are incorporated herein by reference.

BACKGROUND OF THE INVENTION

The present invention relates to a design approach for integrating a passive matrix force touch sensor with a display panel, in a way that allows the sensor matrix to lie over, that is to say on top of, the display. The invention therefore includes an apparatus having integrated display devices and touch sensing devices, a method of integrating pressure-sensitive sensors with light-emitting picture elements and a touch-screen including a processor for powering light-emitting elements and energizing pressure-sensitive elements.

It is known to provide an apparatus having integrated display devices and touch sensing devices. However, a problem exists in that touch sensitivity is enhanced if the touch sensing devices are placed on top of the light emitting devices. However, it is then necessary for the touch sensitive devices to be transparent and any opacity introduced into the configuration will limit the amount of light emitted from the light emitting devices. Thus, from a light-emitting perspective, it is preferable for the light emitting devices to be on top.

BRIEF SUMMARY OF THE INVENTION

According to an aspect of the present invention, there is provided an apparatus having integrated display devices and touch-sensing devices, as claimed in the claims.

In an embodiment, the picture elements within said black matrix have a first definition; said sensor matrix has a second definition; and said second definition is lower than said first definition.

According to a second aspect of the present invention, there is provided a method of integrating pressure sensitive sensors with light-emitting picture elements, as claimed in claims.

According to a third aspect of the present invention, there is provided a touch-screen including a processor for powering light-emitting picture elements and energizing pressure sensitive elements, as claimed in the claims.

Embodiments of the invention will be described, by way of example only, with reference to the accompanying drawings. The detailed embodiments show the best mode known to the inventor and provide support for the invention as claimed. However, they are only exemplary and should not be used to interpret or limit the scope of the claims. Their purpose is to provide a teaching to those skilled in the art.

DETAILED DESCRIPTION OF EMBODIMENTS OF THE INVENTION

FIG. 1

Figure 1:
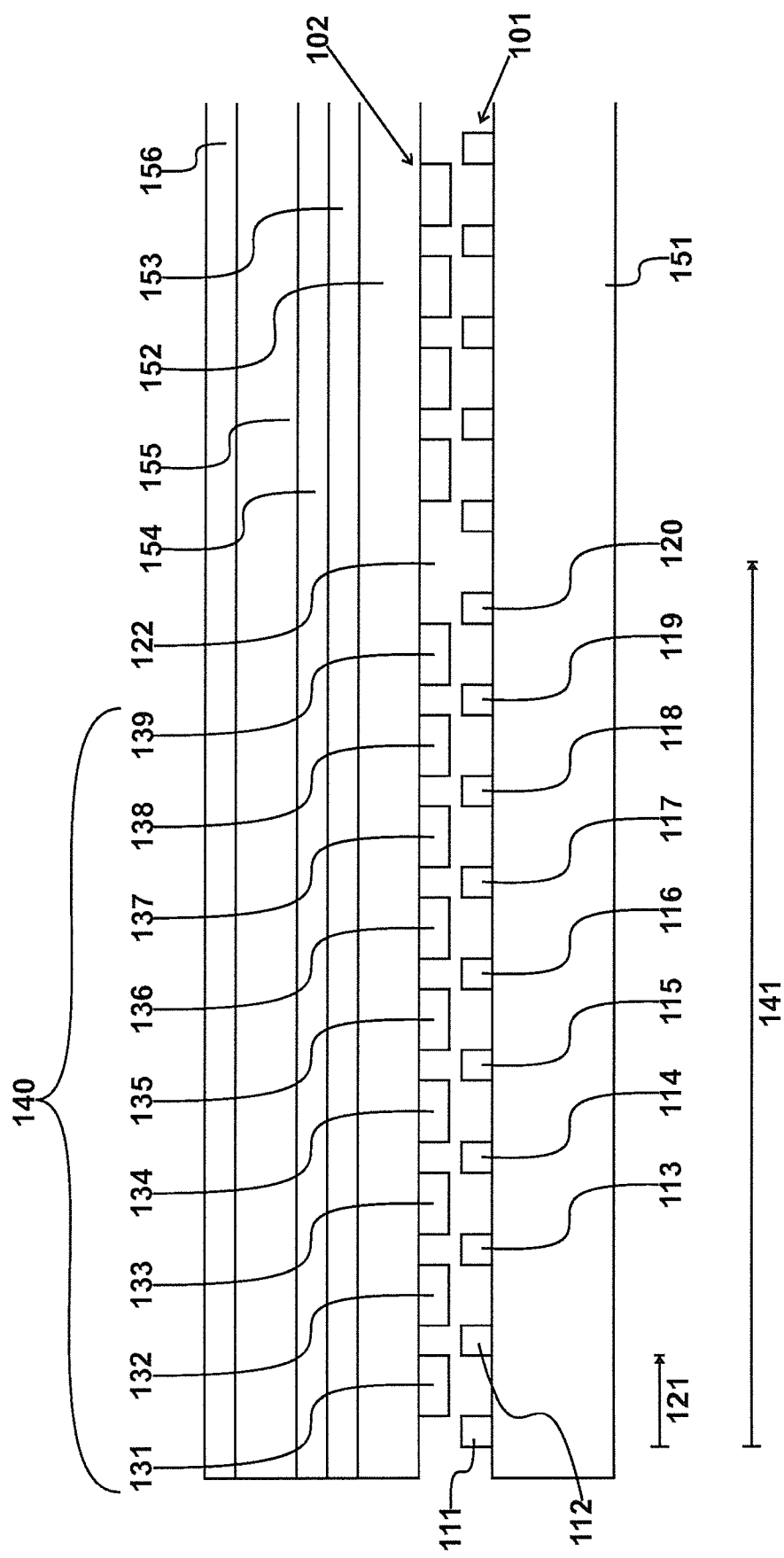
FIG. 1 shows a cross-section of an apparatus having display devices and touch sensing devices.

An apparatus is shown in FIG. 1 having display devices 101 and touch sensing devices 102. The display devices 101 are implemented as individual light-emitting picture elements, including a first light-emitting picture element 111, a second light-emitting picture element 112, a third light-emitting picture element 113, a fourth light-emitting picture element 114, a fifth light-emitting picture element 115, a sixth light-emitting picture element 116, a seventh light-emitting picture element 117, an eighth light-emitting picture element 118, a ninth light-emitting picture element 119 and a tenth light-emitting picture element 120. Each of these picture elements (111 to 120) may be individually addressed to define the definition of the resulting image. Alternatively, picture elements emitting light of different colors may be collected together to provide individual colored pixels. Thus, for example, in an embodiment, the first light-emitting picture element 111 could illuminate red, the second light-emitting picture element 112 could illuminate green and the third light-emitting picture element 113 could illuminate blue. Thus, collectively, elements 111 to 113 could define an individual colored pixel.

In the embodiment in which each individual light-emitting picture element is individually addressed, the spacing between these picture elements is defined by a first spacing value 121.

The light-emitting picture elements are surrounded by a black matrix 122 of non-light-emitting regions. Pressure sensitive elements are also arranged to define a sensor matrix that includes groups of pressure sensing devices. A group of this type is defined by a first pressure sensing device 131, a second pressure sensing device 132, a third pressure sensing device 133, a fourth pressure sensing device 134, a fifth pressure sensing device 135, a sixth pressure sensing device 136, a seventh pressure sensing device 137, an eighth pressure sensing device 138 and a ninth pressure sensing device 139. Collectively, these pressure sensing devices 131 to 139 define a pressure sensing group 140. Within the group, the pressure sensing devices are electrically connected together and are addressed as a group. In combination, these groups define a sensor matrix and the sensor matrix is located over the black matrix 122. The sensor elements 131 to 139, sensor element in other groups and the conductors between the sensor elements are aligned at positions over the black matrix 122. In this way, the sensor elements do not occlude the picture elements.

Groups of sensor elements are separated by a second spacing value 141. In this way, the picture elements within the black matrix 122 have a first definition while the sensing matrix has a second definition, in which the second definition is lower than the first definition. In this embodiment, the picture element definition is ten times larger than that of the sensor element definition although, in alternative embodiments, differing ratios may be adopted.

Optical definition continues to increase, thereby increasing the sharpness of images when viewed by the eye. However, the definition of the sensor matrix is compatible with that of a user's finger and will therefore tend to remain substantially constant. However, higher definitions may be required if, for example, the device is designed to be used with a stylus.

In this embodiment, an integer number of picture elements in the two-dimensional array are associated with each individual sensor grouping. Thus, the boundaries of individual sensor elements and the resulting boundaries of sensor element groupings align with similar boundaries defined by the light-emitting picture elements but appropriately displaced, such that the sensor elements are aligned at positions over the black matrix and do not occlude the picture elements.

In an embodiment, the picture elements may be of a type selected non-exclusively from a list including electrophoretic devices, liquid crystal devices, organic light emitting diode devices and micro light-emitting diode devices. Thus, in some examples, to become light-emitting, a separate light source may be required. With the diode type devices, the light-emitting elements are active and each receives an appropriate energizing signal. Each sensor group is associated with a plurality of unit cells, wherein each unit cell may be identified as including a single light-emitting picture element or a plurality of elements of differing colors.

In an embodiment, the sensor elements are resistive sensor elements and may be electrically connected by conductive film rows and columns. This conductive film makes a part of the overall sensor matrix and as such is also located over the black matrix.

During construction of the apparatus illustrated in FIG. 1, the method involves integrating pressure sensitive sensors with light emitting picture elements. The light emitting devices are arranged upon a substrate, such as a glass substrate 151. This results in the located light-emitting devices being surrounded by the black matrix 122 of the non-light emitting regions. Thereafter, a sensor matrix of pressure sensitive sensor elements is located over this black matrix, such that the sensor elements are aligned at positions of the black matrix and do not occlude the picture elements. In an embodiment, the sensor elements are located over the positions of the black matrix.

To complete the assembly, a transparent sheet may be placed over the sensor matrix. In the embodiment of FIG. 1, a first glass cover 152 is located over the sensor matrix. This is retained in place by an optically clear adhesive 153 which is in turn covered by an ultraviolet filter 154. A second glass cover 155 is placed over the ultraviolet film 154, whereafter a final optical film 156 is deployed. In an embodiment, the optical film 156 may be scratch resistant and may provide anti-reflective properties.

FIG. 2

Figure 2:
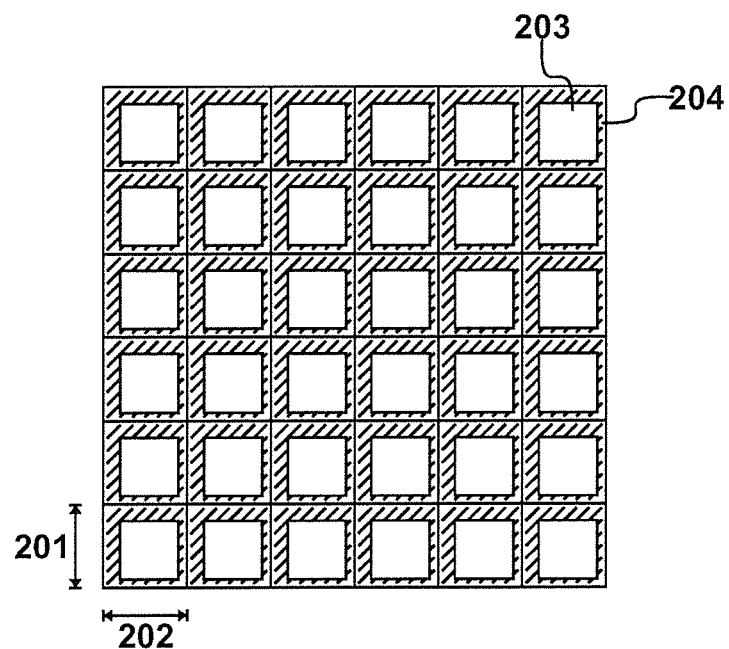
FIG. 2 shows a top view of an alternative embodiment.

A top view of an alternative embodiment is shown in FIG. 2. This provides for the assembly of a passive matrix sensor array comprising coplanar electrodes in every sensel. In an embodiment, the design may be integrated in-cell to a display matrix. In another embodiment, the sensels are integrated onto the cells of the display.

In the embodiment of FIG. 2, each display device or cell has a first dimension 201 and a second dimension 202 in the plane of the device. Thus, each cell may be identified as an individual pixel and for a color display, each pixel will include a red, green and blue subpixel. Each pixel comprises a light emitting or transparent area 203 and an opaque area 204 that is referred to as a black-matrix. In many displays, the black matrix is considered desirable because it provides for color separation between neighboring pixels and enhances the sharpness of the displayed image.

FIG. 3

Figure 3:
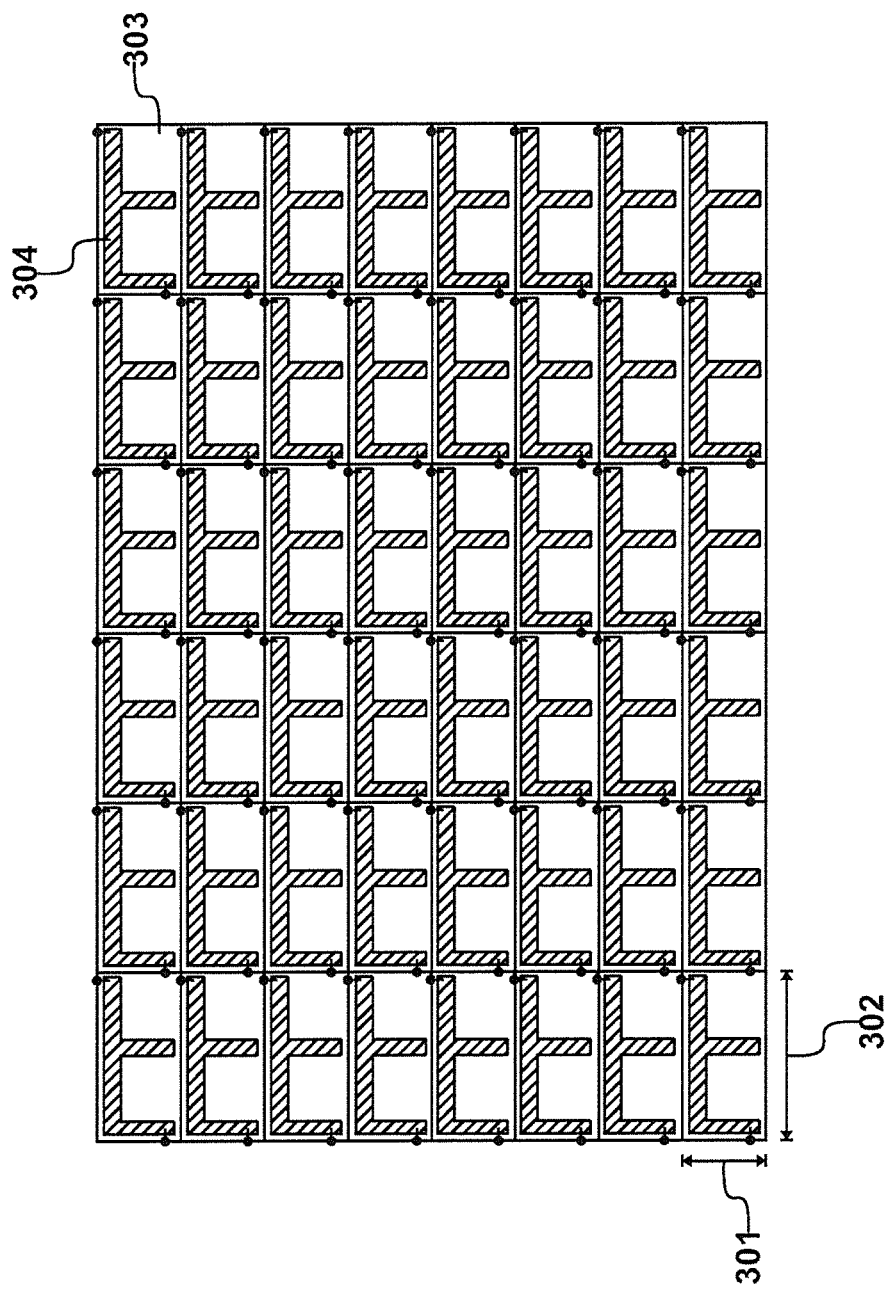
FIG. 3 shows a schematic representation of a passive matrix sensor array that is placed on top of the display of FIG. 2.

A schematic representation of a passive matrix sensor array, that is placed on top of a display, is illustrated in FIG. 3. The array of FIG. 3 is fabricated on a transparent substrate for on-cell operation, or directly on top of a transparent overcoat layer over the pixels for an in-cell operation. In this way, openings, such as opening 303, align with light-emitting/transmitting areas of the pixels underneath, such as pixel 203 and do not interfere with the displayed image.

A passive matrix sensor array is fabricated from a metal 304 or other conductive film of rows and columns. At each intersection, a resistive element is laid out and the resistive element occupies the area of the black matrix 204. In an embodiment, the resistive element is a QTC® resistor of the type available from the present applicant. A QTC® resistor comprises a quantum tunneling material or composite that is pressure sensitive and which is configured to provide a variable resistance in response to mechanical interactions such as the application of force or pressure.

In this example, the passive matrix sensels have dimensions 301 and 302. To achieve correct alignment, dimension 301 is an integer multiple of dimension 201 and dimension 302 is an integer multiple of dimension 202.

The array of sensels may be larger than the display of pixels and at high pixel densities, force input with a human finger may cover hundreds of the picture elements. Thus, in this environment, it is beneficial to enlarge the area of each sensel, such that the spatial resolution is not unnecessarily high and the QTC® resistor, by covering a larger area, provides a higher rated output.

Although the arrays are closely aligned, it should be appreciated that each provides an independent system. The operations of these systems are not necessarily synchronous. Thus, the sensels may be scanned at the same frame rate at which the display is scanned or a slower scanning speed may be preferred, dependent upon application.

Experiments suggest that the approach could be particularly attractive when using active matrix organic light emitting diode device panels, given that known arrangements provide a substantial area covered by the black matrix. Thus, a passive force sensor with co-planar interdigitated electrodes could be integrated with a typical high-resolution active matrix organic light emitting display (OLED) where dimensions 201 and 202 may be typically one hundred and eighteen micrometers (118 µm). In an embodiment, a unit cell may have pixels with one red device, one blue device and two green devices. In a system of this type, OLED emitters may occupy typically 20% of the pixel area with the remaining 80% being covered by the black matrix. For the sensor array, each sensel would be designed to cover several of the light emitting pixels.

FIG. 4

Figure 4:
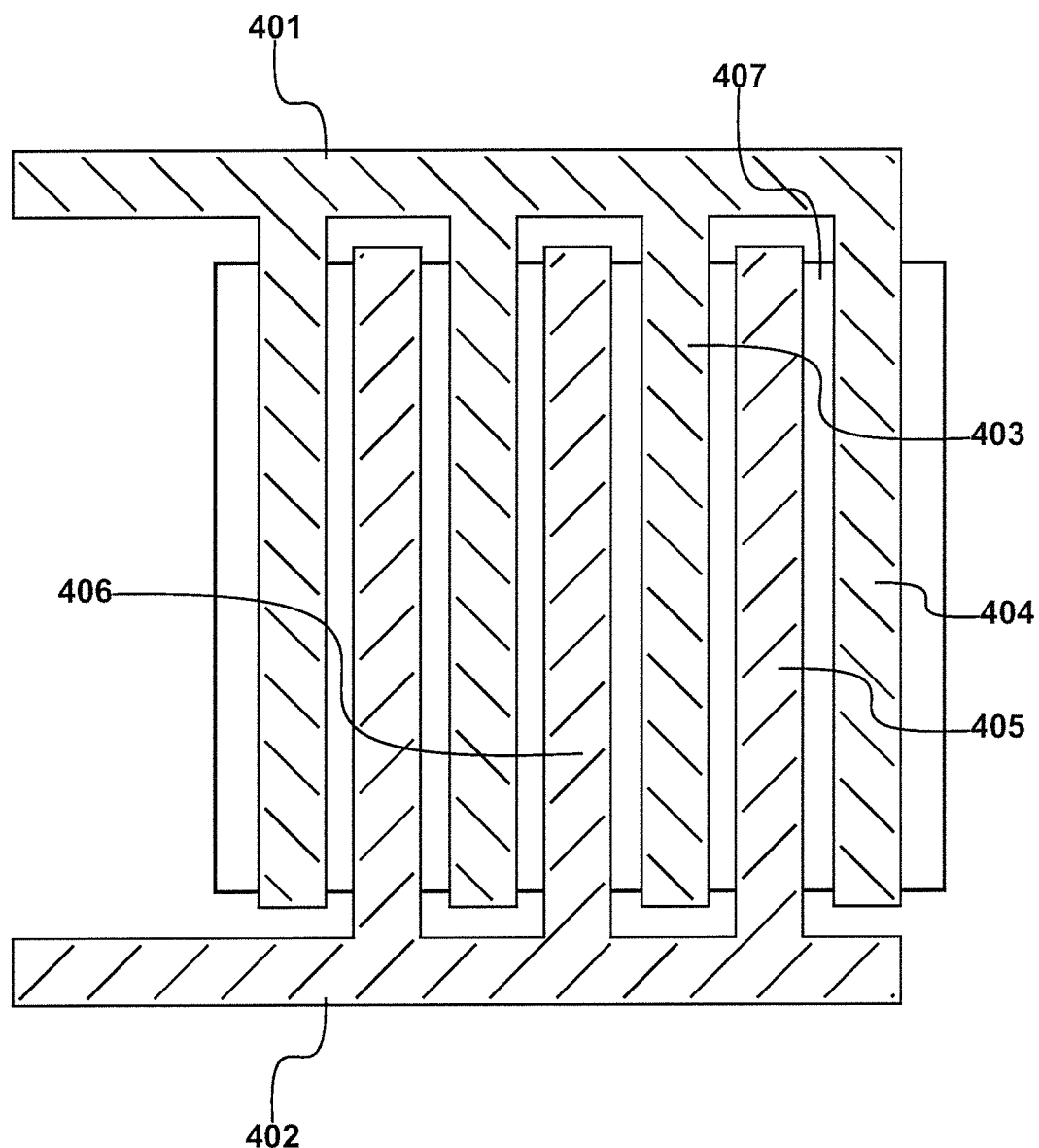
FIG. 4 shows an example of a force sensor sensel.

An example of a force sensor sensel is shown in FIG. 4. This includes a first electrode 401 and a second electrode 402. A first electrode 401 includes fingers 403, 404 etc. These fingers 403, 404 of the first electrode 401 are interdigitated with similar fingers 405, 406 of the second electrode 402. The area of the interdigitated fingers is covered by a force sensitive film 407. The force sensitive film is constructed from a material that presents a contact resistance with the electrode that varies with a force applied normally to the plane and the film.

FIG. 5

Figure 5:
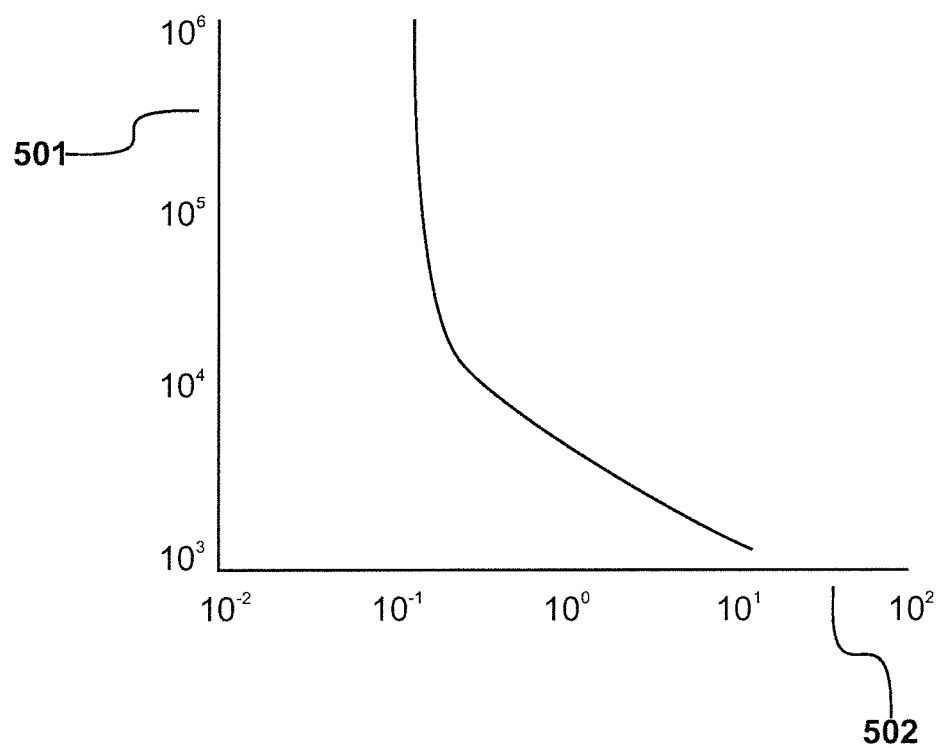
FIG. 5 shows a functional relationship between electrodes of the type shown in FIG. 4.

A functional relationship between electrodes, of the type shown in FIG. 4, for a typical quantum tunneling composite force sensing material with an area of eighty square millimeters is illustrated in FIG. 5. A typical contact area, resulting from a finger press, typically provides a contact area of eighty square millimeters.

The relationship shown in FIG. 5 shows resistance 501 plotted against force 502 on logarithmic scales. Thus, the force applied, measured in Newtons, ranges from 100th of a Newton (0.1 N) to one hundred Newtons (100 N). Over this range, resistance starts to drop when a force of 1/10th of a Newton (0.1 N) is applied up to ten Newtons (10 N) being applied. Over this range, the presented resistance drops from one mega-ohm (1 MΩ) to approximately one kilo-ohm (1 kΩ).

Experiments have been conducted with sensel sizes of approximately one square millimeter (1×1 mm) and four-square millimeters (2×2 mm). A summary of the responses achieved is illustrated in Table 1.

TABLE 1

|  | Embodiment 1 | Embodiment 2 |
|---|---|---|
| QTC sensel dimensions | 0.944 × 0.944 mm² | 2.006 × 2.004 mm² |
| AMOLDED unit cells covered per sensel | 8 × 8 cells | 17 × 17 cells |
| AMOLDED pixels covered per sensel | 16 × 16 pixels | 34 × 34 pixels |
| QTC sensels to cover entire display (113 mm × 55 mm) | 120 × 58 sensels | 56 × 27 sensels |
| BM area per sensel | 0.736 mm² | 3.324 mm² |
| Assumption of BM area per sensel that is covered by QTC and available to sense force (75%) | 0.55 mm² | 2.49 mm² |
| Expected range of sensor resistance when finger applies 0-10 N (80 mm² contact area) | ∞ to 36 kΩ | ∞ to 144 kΩ |

In some applications, it may be appropriate to provide a degree of rotation between the arrays in order to use straight lines for the row and column electrodes. The electrodes themselves may appear opaque or may be semi-transparent or transparent.

It is appreciated that if straight lines for the electrodes are to be used with active matrix organic light emitting diode devices, the passive matrix of the QTC® array rows and columns will run diagonally, with respect to the rows and columns of the display. Should such a configuration be considered undesirable, it is possible to zig-zag the electrodes. Such an approach provides an advantage in that it should be more robust against bending but will in turn introduce higher electrode resistance.

The invention claimed is:

1. An apparatus having integrated display devices and touch-sensing devices, comprising:
   light-emitting picture elements surrounded by a black matrix of non-light-emitting regions; and
   pressure sensitive resistive sensor elements arranged in a sensor matrix and electrically connected by conductive film rows and columns,
   wherein:
   said sensor matrix is located over said black matrix; and
   said sensor elements and said conductive film rows and columns between said sensor elements are aligned at positions over said black matrix, such that said sensor elements do not occlude said light-emitting picture elements; and
   said light-emitting picture elements within said black matrix have a first integer number;
   said sensor matrix has a second integer number; and
   said second integer number is lower than said first integer number.

2. The apparatus of claim 1, wherein said first integer number is substantially ten times larger than that of the second integer number.

3. The apparatus of claim 1, wherein said integer number of light-emitting picture elements in a two-dimensional array are associated with each individual sensor element.

4. The apparatus of claim 1, wherein said light-emitting picture elements are of a type selected from any one of the following:
   electrophoretic devices;
   liquid crystal devices;
   organic light emitting diode devices and
   micro light emitting diode devices.

5. The apparatus of claim 1, wherein each light-emitting picture element is configured to emit light of a particular color selected from a set of available colors.

6. The apparatus of claim 5, wherein examples of said available colors are included in each of a plurality of unit cells within said black matrix.

7. The apparatus of claim 6, wherein each sensor element is associated with a plurality of said unit cells.

8. The apparatus of claim 1, wherein said resistive sensor elements comprise:
   a first plurality of finger elements;
   a second plurality of finger elements, wherein said second plurality of finger elements are interdigitated with said first plurality of finger elements; and
   a force sensitive film overlaying said interdigitated finger elements.

9. A method of integrating pressure sensitive sensors with light-emitting picture elements, comprising the steps of:
   arranging light-emitting picture elements upon a substrate, such that located light-emitting picture elements are surrounded by a black matrix of non-light-emitting regions,
   arranging said light-emitting picture elements to have a first integer number;
   locating a sensor matrix of pressure sensitive resistive sensor elements electrically connected by conductive film rows and columns over said black matrix, such that said sensor elements are aligned at positions of said black matrix and do not occlude said picture elements; and arranging said sensor matrix to have a second integer number, wherein said second integer number is lower than said first integer number.

10. The method of claim 9, further comprising the step of locating said sensor elements over said positions of said black-matrix.

11. The method of claim 9, further comprising the step of placing a transparent sheet over said sensor matrix.

12. A touch-screen including a processor for powering light-emitting picture elements and energizing pressure sensitive sensor elements, wherein:

manual interaction is received upon a top transparent surface and light-emitting picture elements are supported by an opaque substrate;

said light-emitting picture elements are surrounded by a black matrix defining portions that do not emit light;

said pressure sensitive resistive sensor elements are arranged in a sensor matrix and electrically connected by conductive film rows and columns, wherein said sensor matrix has a first integer number lower than a second integer number of said light-emitting picture elements; and said sensor elements and said conductive film rows and columns between said sensor elements are aligned at positions above said black matrix, such that components of said sensor matrix do not occlude said light-emitting picture elements.

13. The touch-screen of claim 12, wherein said first integer number is substantially ten times larger than that of the second integer number.

14. The touch screen of claim 12, wherein an integer number of light-emitting picture elements in a two-dimensional array are associated with each individual sensor element.

15. The touch screen of claim 12, wherein said light-emitting picture elements are of a type selected from any one of the following:
electrophoretic devices;
liquid crystal devices;
organic light emitting diode devices and
micro light emitting diode devices.

* * * * *